(12) United States Patent
Kim et al.

(10) Patent No.: US 11,026,330 B2
(45) Date of Patent: Jun. 1, 2021

(54) DISPLAY DEVICE

(71) Applicant: Samsung Display Co., Ltd., Yongin-si (KR)

(72) Inventors: Sung-jun Kim, Hwaseong-si (KR); Minsoo Kang, Hwaseong-si (KR); Yongsu Lim, Seoul (KR); Duckyong Ahn, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 16/459,192

(22) Filed: Jul. 1, 2019

(65) Prior Publication Data

US 2020/0077518 A1   Mar. 5, 2020

(30) Foreign Application Priority Data

Aug. 30, 2018 (KR) .......................... 10-2018-0102505

(51) Int. Cl.
| | |
|---|---|
| *H05K 7/10* | (2006.01) |
| *H05K 1/14* | (2006.01) |
| *H05K 1/11* | (2006.01) |
| *H05K 1/09* | (2006.01) |
| *H05K 1/18* | (2006.01) |
| *H01L 27/32* | (2006.01) |
| *G02F 1/1345* | (2006.01) |
| *G02F 1/1362* | (2006.01) |

(52) U.S. Cl.
CPC ......... *H05K 1/147* (2013.01); *G02F 1/13452* (2013.01); *H01L 27/3276* (2013.01); *H05K 1/09* (2013.01); *H05K 1/118* (2013.01); *H05K 1/189* (2013.01); *G02F 1/136286* (2013.01); *H05K 2201/10128* (2013.01); *H05K 2201/10136* (2013.01)

(58) Field of Classification Search
USPC ......................................................... 361/767
See application file for complete search history.

(56) References Cited

U.S. PATENT DOCUMENTS

| | | | |
|---|---|---|---|
| 9,229,570 B2 | 1/2016 | Choi et al. | |
| 9,992,862 B2 | 6/2018 | Shin et al. | |
| 10,037,984 B2 | 7/2018 | Oh | |
| 2006/0284821 A1* | 12/2006 | Takenaka | H05K 3/361 |
| | | | 345/100 |
| 2012/0319144 A1* | 12/2012 | Fujikawa | H01L 27/12 |
| | | | 257/88 |

(Continued)

FOREIGN PATENT DOCUMENTS

| | | |
|---|---|---|
| KR | 10-0947272 B1 | 3/2010 |
| KR | 10-2014-0045151 A | 4/2014 |
| KR | 10-2016-0085388 A | 7/2016 |

(Continued)

*Primary Examiner* — Andargie M Aychillhum
(74) *Attorney, Agent, or Firm* — Lewis Roca Rothgerber Christie LLP

(57) ABSTRACT

A display device includes a display panel, a first connection circuit board, a second connection circuit board, and a sealing member. The display panel may include an insulation layer, a first pad, and a second pad. A distance between a top surface of the insulation layer and a bottom surface of the second connection circuit board may be substantially the same as that between the top surface of the insulation layer and a top surface of the first connection circuit board.

20 Claims, 12 Drawing Sheets

(56) References Cited

U.S. PATENT DOCUMENTS

2019/0229446 A1 7/2019 Kim et al.
2019/0245283 A1 8/2019 Oh

FOREIGN PATENT DOCUMENTS

| KR | 10-2018-0027692 A | 3/2018 |
| KR | 10-2019-0090102 A | 8/2019 |
| KR | 10-2019-0096463 A | 8/2019 |

* cited by examiner

DISPLAY DEVICE

CROSS-REFERENCE TO RELATED APPLICATION

This application claims priority to and the benefit of Korean Patent Application No. 10-2018-0102505, filed on Aug. 30, 2018, the entire content of which is hereby incorporated by reference.

BACKGROUND

1. Field

The following disclosure is related to a display device.

2. Description of the Related Art

In general, after a display panel is manufactured, a circuit board is connected to the display panel. For example, in a tape automated bonding (TAB) mounting process, the circuit board is bonded to the display panel by utilizing an anisotropic conductive film (ACF).

In recent years, design schemes for display devices with strong durability while a bezel area (or a non-display area) is reduced have been actively researched.

SUMMARY

An aspect of the present disclosure is directed toward a display device that is capable of preventing or substantially preventing a sealing member from being damaged.

An aspect of the present disclosure is also directed toward a display device that is capable of preventing or substantially preventing a display panel pad unit from being damaged.

According to an embodiment of the inventive concept, a display device includes a display panel, a first connection circuit board, a second connection circuit board, and a sealing member.

In one embodiment, the display panel may include an insulation layer, first pads arranged with each other in a first direction and exposed from the insulation layer, and second pads arranged with each other in the first direction and exposed from the insulation layer.

In one embodiment, the first connection circuit board may include a first external insulation layer and first output pads, the first output pads arranged with each other in the first direction, exposed from the first external insulation layer, and electrically connected to the first pads.

In one embodiment, the second connection circuit board may be above the first connection circuit board and include a second external insulation layer and second output pads, the second output pads arranged with each other in the first direction, exposed from the second external insulation layer, and electrically connected to the second pads.

In one embodiment, a sealing member may be configured to seal a gap between the second connection circuit board and the insulation layer.

In one embodiment, the second pads may be farther from an edge of the display panel than the first pads in a second direction crossing the first direction.

In one embodiment, a distance between a top surface of the insulation layer and a bottom surface of the second connection circuit board may be substantially the same as that between the top surface of the insulation layer and a top surface of the first connection circuit board.

In one embodiment, the first pad and the second pad may have substantially the same thickness, and the second output pad may have a thickness that is substantially the same as a sum of a thickness of the first output pad and a thickness of the first connection circuit board.

In one embodiment, the first output pad may have a thickness of about 5 micrometers to about 10 micrometers, and the second output pad may have a thickness of about 40 micrometers to about 50 micrometers.

In one embodiment, the first output pad and the second output pad may have substantially the same thickness, and the second pad may have a thickness greater than that of the first pad.

In one embodiment, a sum of a thickness of the second output pad and a thickness of the second pad may be substantially the same as a sum of a thickness of the first output pad, a thickness of the first pad, and a thickness of the first connection circuit board.

In one embodiment, the display device may further include: a first conductive adhesion member and a second conductive adhesion member. In one embodiment, the first conductive adhesion member may be between the first pad and the first output pad to electrically connect the first pad to the first output pad; and the second conductive adhesion member may be between the second pad and the second output pad to electrically connect the second pad to the second output pad.

In one embodiment, the first pad and the second pad may have substantially the same thickness.

In one embodiment, the first output pad and the second output pad may have substantially the same thickness, and the second conductive adhesion member may have a thickness greater than that of the first conductive adhesion member.

In one embodiment, the first pad and the second pad may have substantially the same thickness, and a sum of a thickness of the second conductive adhesion member and a thickness of the second output pad may be substantially the same as a sum of a thickness of the first conductive adhesion member, a thickness of the first output pad, and a thickness of the first connection circuit board.

In one embodiment, the first output pad and the second output pad may have the same thickness, and a sum of a thickness of the second conductive adhesion member and a thickness of the second pad may be substantially the same as a sum of a thickness of the first conductive adhesion member, a thickness of the first pad, and a thickness of the first connection circuit board.

In one embodiment, the sealing member may cover an edge area of the first connection circuit board overlapping the display panel, and an edge area of the second connection circuit board overlapping the display panel.

In one embodiment, each of the first output pad and the second output pad may be made of copper.

In one embodiment, the first connection circuit board may further include a first driving chip, the second connection circuit board may further include a second driving chip, a portion of the first connection circuit board overlapping the first driving chip in the first direction may have a width less than a portion of the first connection circuit board overlapping the first output pads in the first direction, and a portion of the second connection circuit board overlapping the second driving chip in the first direction may have a width less than a portion of the second connection circuit board overlapping the second output pads in the first direction.

In an embodiment of the inventive concept, a display device includes a display panel, a first connection circuit board, a second connection circuit board, and a sealing member.

In one embodiment, the display panel may include an insulation layer, first pads arranged with each other in a first direction and exposed from the insulation layer, and second pads arranged with each other in the first direction and exposed from the insulation layer.

In one embodiment, the first connection circuit board may include a first external insulation layer and first output pads, the first output pads arranged with each other in the first direction, exposed from the first external insulation layer, and electrically connected to the first pads.

In one embodiment, the second connection circuit board may be above the first connection circuit board and include a second external insulation layer and second output pads, the second output pads arranged with each other in the first direction, exposed from the second external insulation layer, and electrically connected to the second pads.

In one embodiment, the sealing member may be configured to seal a gap between the insulation layer and each of the first connection circuit board and the second connection circuit board.

In one embodiment, the second pads may be farther from an edge of the display panel than the first pads in a second direction crossing the first direction, and a sum of a thickness of the second pad and a thickness of the second output pad may be greater than a sum of a thickness of the first pad and a thickness of the first output pad.

In one embodiment, the thickness of the first pad may be substantially the same as that of the second pad, and the thickness of the first output pad may be greater than that of the second output pad.

In one embodiment, the thickness of the first pad may be greater than that of the second pad, and the thickness of the first output pad may be substantially the same as that of the second output pad.

In one embodiment, the thickness of the first pad may be greater than that of the second pad, and the thickness of the first output pad may be greater than that of the second output pad.

In one embodiment, the sum of the thickness of the first pad and the thickness of the first output pad may be about 40 micrometers to about 50 micrometers greater than the sum of the thickness of the second pad and the thickness of the second output pad.

In one embodiment, the sealing member may cover an edge area of the first connection circuit board overlapping the display panel, and an edge area of the second connection circuit board overlapping the display panel.

In one embodiment, each of the first output pad and the second output pad may be made of copper.

In one embodiment, the first connection circuit board may further include a first driving chip, the second connection circuit board may further include a second driving chip, a portion of the first connection circuit board overlapping the first driving chip in the first direction may have a width less than a portion of the first connection circuit board overlapping the first output pads in the first direction, and a portion of the second connection circuit board overlapping the second driving chip in the first direction may have a width less than a portion of the second connection circuit board overlapping the second output pads in the first direction.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
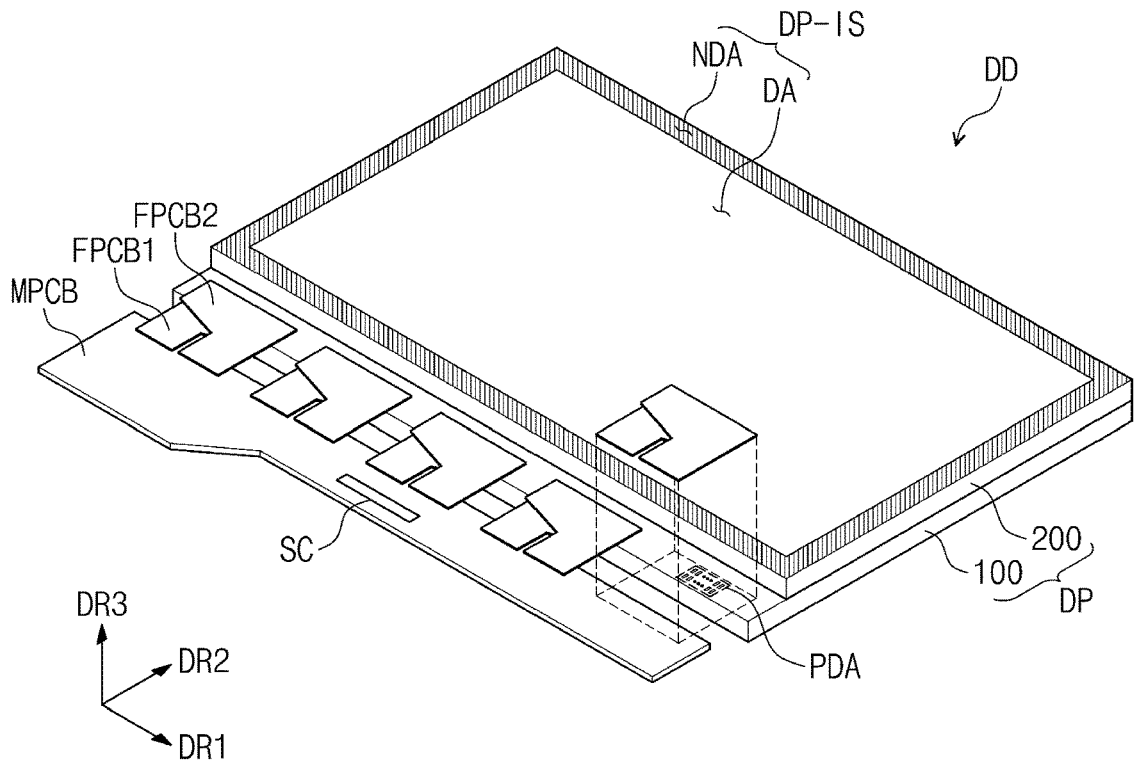
FIG. 1A is a perspective view of a display device according to an embodiment of the inventive concept.

In this specification, it will be understood that when one component (or region, layer, portion, etc.) is referred to as being "on," "connected to," or "coupled to" another component, it can be directly on, connected to, or coupled to the other component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, an element referred to as a first element in one embodiment can be referred to as a second element in another embodiment without departing from the scope of the appended claims. The terms of a singular form may include plural forms as well, unless the context clearly indicates otherwise.

Also, the terms such as "under", "below", "above", "upper", and the like are used for explaining relation association of components illustrated in the drawings. The terms may be a relative concept and described based on directions expressed in the drawings. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Unless otherwise defined, all terms (including technical and scientific terms) used herein have the same meaning as commonly understood by a person of ordinary skill in the art to which this invention belongs. Also, terms such as those defined in commonly used dictionaries are to be interpreted as having meanings consistent with meaning in the context of the relevant art, and will not be interpreted in an idealized or overly formal sense unless expressly so defined herein.

It will be further understood that the terms "comprises," "comprising," "include," and "including," when used in this specification, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

The use of "may" when describing embodiments of the inventive concept refers to "one or more embodiments of the inventive concept." As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, exemplary embodiments of the inventive concept will be described with reference to the accompanying drawings.

Figure 1B:
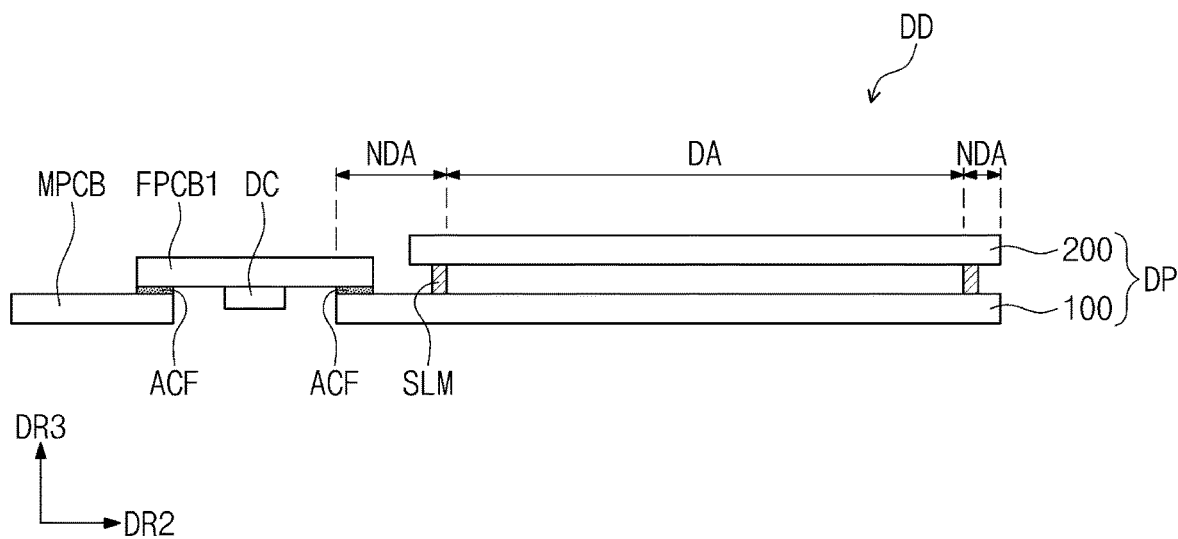
FIG. 1B is a cross-sectional view of the display device according to an embodiment of the inventive concept.
Figure 2:
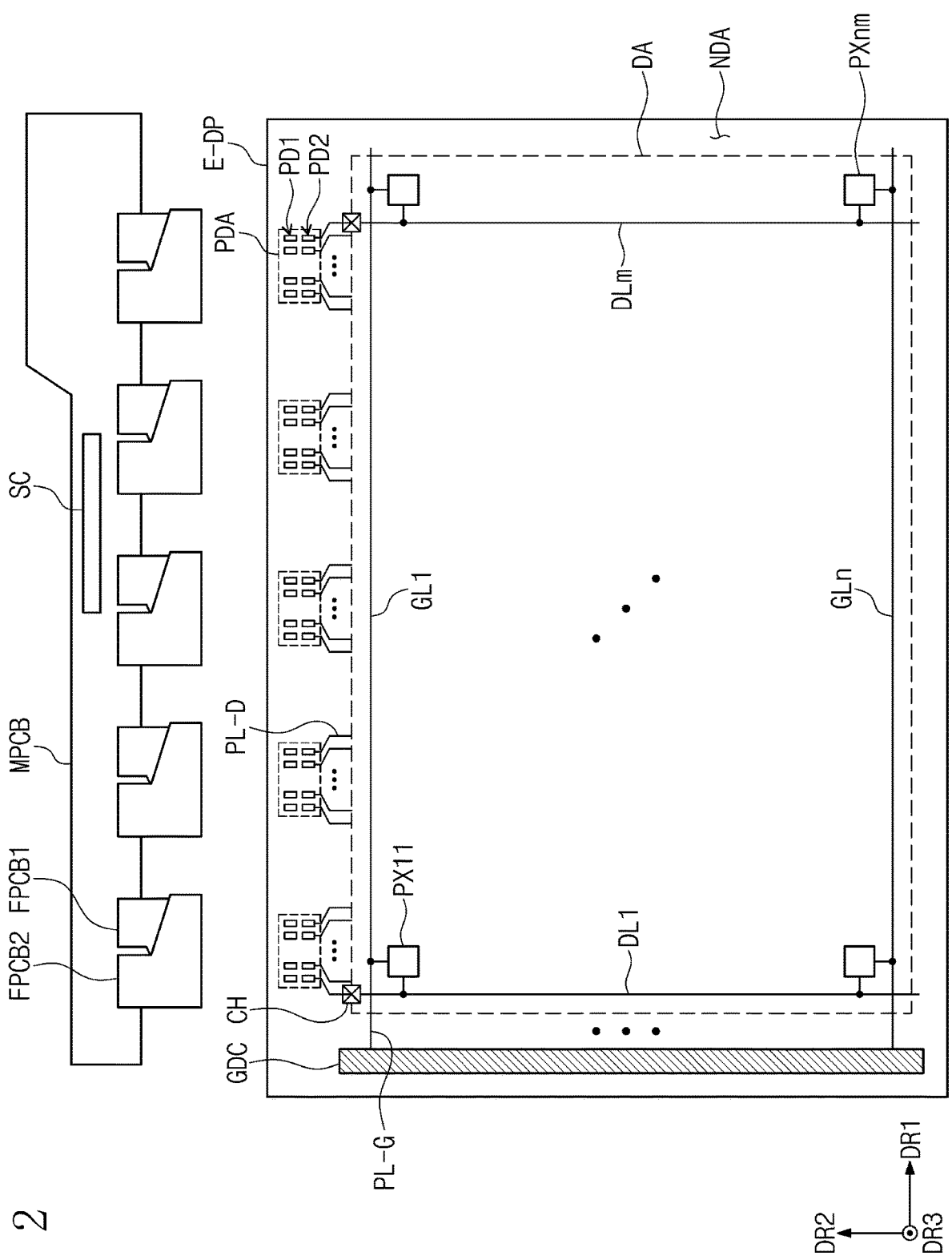
FIG. 2 is a plan view of the display device according to an embodiment of the inventive concept.

FIG. 1A is a perspective view of a display device DD according to an embodiment of the inventive concept. FIG. 1B is a cross-sectional view of the display device DD according to an embodiment of the inventive concept. FIG. 2 is a plan view of the display device DD according to an embodiment of the inventive concept.

Referring to FIGS. 1A-2, the display device DD includes a display panel DP, connection circuit boards FPCB1 and FPCB2, and a main circuit board MPCB. Although a driving chip DC is shown to be mounted on the connection circuit boards FPCB1 and FPCB2 in this embodiment, embodiments of the inventive concept are not limited thereto. The driving chip DC may not be mounted on the connection circuit boards FPCB1 and FPCB2, but may instead be mounted on the display panel DP or the main circuit board MPCB.

When the driving chip DC is mounted on the first connection circuit board FPCB1, the driving chip DC may be called (e.g., referred to as) a first driving chip. When the driving chip DC is mounted on the second connection circuit board FPCB2, the driving chip DC may be called (e.g., referred to as) a second driving chip.

In some embodiments, the display device DD may further include a chassis member in the form of a molding member and also may further include a backlight unit according to a kind of display panel DP.

The display panel may be one selected from a liquid crystal display panel, a plasma display panel, an electrophoretic display panel, a microelectromechanical system (MEMS) display panel, an electrowetting display panel, and an organic light emitting display panel, but embodiments of the inventive concept are not specifically limited thereto.

The display panel DP may include a first display substrate 100 and a second display substrate 200 spaced apart from the first display substrate 100 to face the first display substrate 100. A set or predetermined cell gap may be defined between the first display substrate 100 and the second display substrate 200. The cell gap may be maintained by a sealant SLM through which the first display substrate 100 and the second display substrate 200 are coupled to each other. A gradation display layer for generating an image may be disposed between the first display substrate 100 and the second display substrate 200. The gradation display layer may include a liquid crystal layer, an organic light emitting layer, or an electrophoretic layer according to the kind of display panel.

As illustrated in FIG. 1A, the display panel DP may display an image through a display surface DP-IS. The display surface DP-IS is parallel to a surface defined by a first directional axis DR1 and a second directional axis DR2. The display surface DP-IS may include a display area DA and a non-display area NDA. The non-display area NDA is defined along an edge of the display surface DP-IS. The display area DA may be surrounded by the non-display area NDA. In an embodiment of the inventive concept, the non-display area NDA may be disposed on only one side area adjacent to the connection circuit boards FPCB1 and FPCB2.

A normal direction of the display surface DP-IS, i.e., a thickness direction of the display panel DP is indicated by a third directional axis DR3. A front surface (or a top surface) and a rear surface (or a bottom surface) of each of layers or units, which will be described below, are distinguished by the third directional axis DR3. However, the first to third directional axes illustrated in this embodiment may be merely examples. Hereinafter, first to third directions may be directions indicated by the first to third directional axes DR1, DR2, and DR3, and designated by the same reference numerals, respectively.

Although the display panel DP having a planar display surface is illustrated in an embodiment of the inventive concept, embodiments of the inventive concept are not limited thereto. The display device DD may include a curved display surface or a solid display surface. The solid display surface may include a plurality of display areas that indicate different directions. That is, the solid display surface may include a plurality of display areas that are oriented toward different directions.

A signal control unit SC may be mounted on the main circuit board MPCB. The signal control unit SC receives image data and a control signal from an external graphic control unit. The signal control unit SC may provide the control signal to the display panel DP.

The connection circuit boards FPCB1 and FPCB2 are electrically connected to the display panel DP and the main circuit board MPCB, respectively. The connection circuit boards FPCB1 and FPCB2 may transmit a signal from the main circuit board MPCB to the driving chip DC and also transmit a signal from the driving chip DC to the display panel DP. In this embodiment, the driving chip DC may be a data driver circuit. In this embodiment of the inventive concept, the connection circuit boards FPCB1 and FPCB2 may transmit a signal from the signal control unit SC to the display panel DP.

The connection circuit boards FPCB1 and FPCB2 may be connected to the display panel DP and the main circuit board MPCB by conductive adhesion members (e.g., conductive adhesives), respectively. Each of the conductive adhesion members may include an anisotropic conductive film (ACF). Hereinafter, the anisotropic conductive film (ACF) will be described as the conductive adhesion member.

In this embodiment, the connection circuit boards FPCB1 and FPCB2 may include two kinds of circuit boards (e.g., two circuit boards). The two kinds of connection circuit boards FPCB1 and FPCB2 are connected to different pad rows disposed on one pad area PDA. Although the pad area PDA is disposed on the first display substrate 100 in this embodiment, embodiments of the inventive concept are not limited thereto. According to an embodiment of the inventive concept, the pad area PDA may be disposed on the second display substrate 200.

FIG. 2 illustrates an arrangement relationship between signal lines GL1 to GLn, DL1 to DLm, PL-G, and PL-D and pixels PX11 to PXnm on a plane. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The plurality of gate lines GL1 to GLn extend in the first direction DR1 and are arranged with each other in the second direction DR2. The plurality of data lines DL1 to DLm cross the plurality of gate lines GL1 to GLn so that the plurality of data lines DL1 to DLm are insulated from the plurality of gate lines GL1 to GLn. The plurality of gate lines GL1 to GLn and the plurality of data lines DL1 to DLm are disposed to overlap the display area DA. The auxiliary signal lines PL-G and PL-D are disposed to overlap the non-display area NDA and are connected to the plurality of gate lines GL1 to GLn and the plurality of data lines DL1 to DLm.

The auxiliary gate signal lines PL-G connected to the plurality of gate lines GL1 to GLn may be disposed on the same line as the plurality of gate lines GL1 to GLn and may be integrated with the plurality of gate lines GL1 to GLn. In FIG. 2, the plurality of gate lines GL1 to GLn and the auxiliary gate signal lines PL-G are illustrated as one signal line. Here, the gate lines GL1 to GLn and the auxiliary gate signal lines PL-G, which are connected to each other, may be defined as different portions of the one (e.g., the same) signal line, respectively. However, embodiments of the inventive concept are not limited thereto. For example, the gate lines GL1 to GLn and the auxiliary gate signal lines PL-G, which are connected to each other, may be defined to be divided (e.g., a different line) from each other.

The auxiliary data signal lines PL-D connected to the data lines DL1 to DLm may be disposed on a layer different from a layer on which the plurality of data lines DL1 to DLm are disposed. The data lines DL1 to DLm may be electrically connected to corresponding signal lines of the auxiliary data signal lines PL-D through a contact hole CH. The contact hole CH may pass through at least one insulation layer disposed between the data lines DL1 to DLm and the auxiliary data signal lines PL-D. In FIG. 2, two contact holes CH are illustrated as an example.

In an embodiment of the inventive concept, the contact hole CH may be omitted. The data lines DL1 to DLm and the auxiliary data signal lines PL-D may be disposed on the same layer. Here, the data line and the corresponding auxiliary data signal line, which are connected to each other, of the data lines DL1 to DLm and the auxiliary data signal lines PL-D may be defined as one signal line. Here, the data line and the auxiliary data signal line, which are connected to each other, may be defined as different portions of one (e.g., the same) signal line.

Each of the pixels PX11 to PXnm are connected to the corresponding gate lines of the plurality of gate lines GL1 to GLn and the corresponding data lines of the plurality of data lines DL1 to DLm, respectively. Each of the pixels PX11 to PXnm may include a pixel driver circuit and a display element.

Although the pixels PX11 to PXnm having the form of a matrix are illustrated as an example, embodiments of the inventive concept are not limited thereto. The pixels PX11 to PXnm may be disposed in the form of a PenTile. The pixels PX11 to PXnm may be disposed in the form of a diamond.

As illustrated in FIG. 2, two pad rows PD1 and PD2 are disposed on each of the pad areas PDA. Each of the two pad rows PD1 and PD2 includes a plurality of pads arranged with each other in the first direction DR1. The first pad row PD1 may be disposed to be spaced apart from the second pad row PD2 in a direction (e.g., the second direction DR2) crossing the first direction. The second pad row PD2 may be disposed to be further spaced apart (e.g., farther) from an edge E-DP of the display panel DP and to be further adjacent (e.g., closer) to the display area DA than the first pad row PD1 in the second direction DR2. That is, the second pad row PD2 may be located closer to the display area DA than the first pad row PD1 in the second direction DR2. The pads of the first pad row PD1 and the second pad row PD2 are connected to the auxiliary data signal lines PL-D, respectively.

The gate driver circuit GDC may be integrated with the display panel DP through an oxide silicon gate driver circuit (OSG) process or an amorphous silicon gate driver circuit (ASG) process. The auxiliary gate signal lines PL-G receive a gate signal from the gate driver circuit GDC.

Figure 3A:
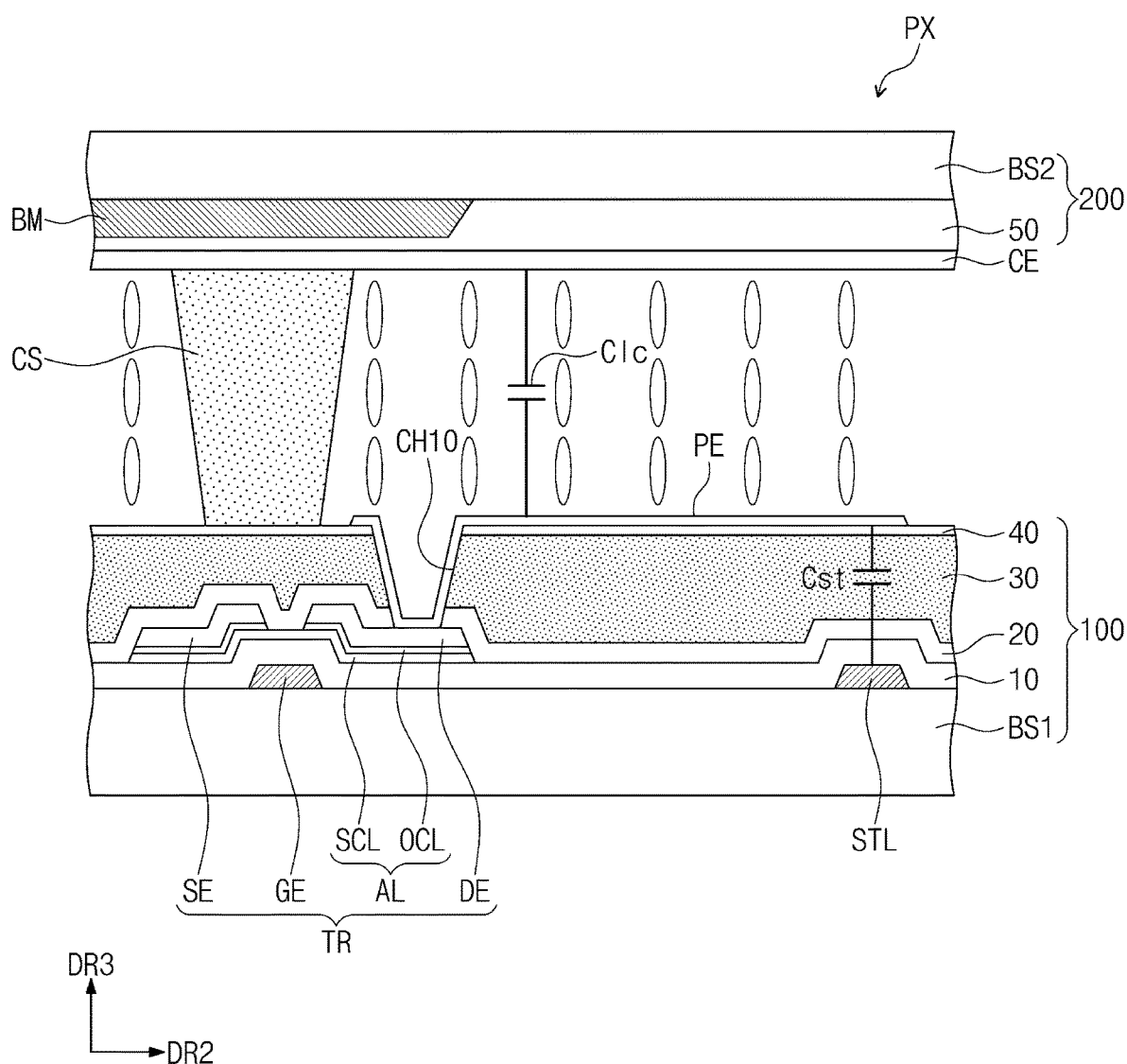
FIGS. 3A-3B are cross-sectional views illustrating a display area of a display panel according to an embodiment of the inventive concept.
Figure 3B:
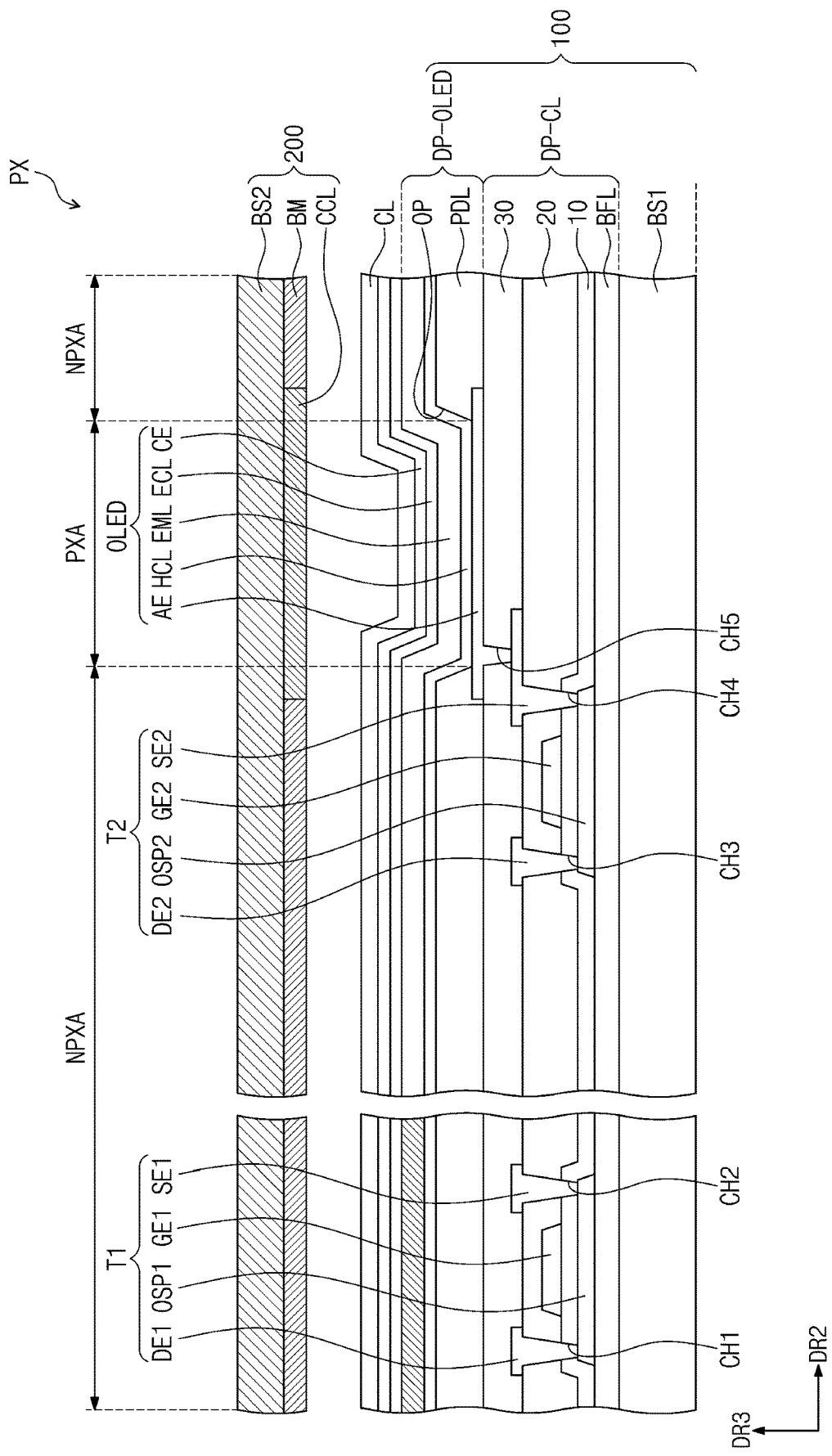

FIGS. 3A-3B are cross-sectional views of the display area DP according to an embodiment of the inventive concept. FIG. 3A illustrates a cross-section corresponding to the pixel PX of the liquid crystal display panel, and FIG. 3B illustrates a cross-section corresponding to the pixel PX of the organic light emitting display panel.

The pixel PX of the liquid crystal display panel may include a transistor TR, a liquid crystal capacitor Clc, and a storage capacitor Cst.

The transistor TR includes a control electrode GE connected to the gate line, an activation part (e.g., an activation layer) AL overlapping the control electrode GE, an input electrode SE connected to the data line, and an outer electrode DE disposed to be spaced apart from the input electrode SE. The liquid crystal capacitor Clc includes a pixel electrode PE and a common electrode CE. The storage capacitor Cst includes the pixel electrode PE and a portion of a storage line STL overlapping the pixel electrode PE.

The control electrode GE and the storage line STL are disposed on one surface of a first base substrate BS1. The first base substrate BS1 may be a glass substrate or a plastic substrate. A first insulation layer 10 (covering the control electrode GE and the storage line STL) is disposed on one surface of the first base substrate BS1. The first insulation layer 10 may include at least one selected from an inorganic material and an organic material. The activation part AL overlapping the control electrode GE is disposed on the first insulation layer. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include an amorphous silicon or a polysilicon. Also, the semiconductor layer SCL may include a metal oxide semiconductor. The ohmic contact layer OCL may include a dopant doped at a density higher than that of the semiconductor layer. The ohmic contact layer OCL may include two portions spaced apart from each other. In an embodiment of the inventive concept, the ohmic contact layer OCL may have an integrated shape (e.g., a continuous body).

An output electrode DE and an input electrode SE are disposed on the activation part AL. The output electrode DE and the input electrode SE are disposed to be spaced apart from each other. A second insulation layer 20 covering the activation layer AL, the output electrode DE, and the input electrode SE is disposed on the first insulation layer 10. A third insulation layer 30 is disposed on the second insulation layer 20. Each of the second insulation layer 20 and the third insulation layer 30 may include at least one selected from an inorganic material and an organic material. The third insulation layer 30 is disposed on the second insulation layer 20. The third insulation layer 30 may be a single organic layer providing a polarization surface. In this embodiment, the third insulation layer 30 may include a plurality of color filters. A fourth insulation layer 40 is disposed on the third insulation layer 30. The fourth insulation layer 40 may be an inorganic layer covering the color filters.

As illustrated in FIG. 3A, an pixel electrode PE is disposed on the fourth insulation layer 40. The pixel electrode PE is connected to the output electrode DE through the contact hole CH10 passing through the second insulation layer 20, the third insulation layer 30, and the fourth insulation layer 40. An alignment layer covering the pixel electrode PE may be disposed on the fourth insulation layer 40.

A second base substrate BS2 may be a glass substrate or a plastic substrate. A black matrix layer BM is disposed on a bottom surface of the second base substrate BS2. That is, openings corresponding to the pixel areas may be defined (e.g., included) in the black matrix layer BM. A spacer CS may be disposed to overlap the black matrix layer BM.

The insulation layers covering the black matrix layer BM are disposed on a bottom surface of the second base substrate BS2. FIG. 3A illustrates an example of a fifth insulation layer 50 providing a polarization surface. The fifth insulation layer 50 may include an organic material.

As illustrated in FIG. 3A, the common electrode CE is disposed on the bottom surface of the second base substrate BS2. A common voltage is applied to the common electrode CE. The common voltage and the pixel voltage may have values different from each other.

The cross-section of the pixel PX illustrated in FIG. 3A may be merely an example. The first display substrate 100 and the second display substrate 200 may be turned upside down in the third direction DR3. The color filters may be disposed on the second display substrate 200.

Although a liquid crystal display panel in a vertical alignment (VA) mode is exemplarily described with reference to FIG. 3A, according to an embodiment of the inventive concept, a liquid crystal display panel in an in-plane switching (IPS) mode, a fringe-field switching (FFS) mode, a planar to linear switching (PLS) mode, a super vertical alignment (SVA), or a surface-stabilized vertical alignment (SS-VA) mode may be applied.

As illustrated in FIG. 3B, the pixel PX of the organic light emitting display panel may include a switching transistor T1, a driving transistor T2, and a light emitting diode OLED.

The organic light emitting display panel includes a display substrate 100 and an encapsulation substrate (or a second display substrate) 200. The display substrate 100 includes a first base substrate BS1, a circuit device layer DP-CL disposed on the first base substrate BS1, a display device layer DP-OLED disposed on the circuit device layer DP-CL, and a cover layer CL disposed on the display device layer DP-OLED. The encapsulation substrate 200 may include a second base substrate BS2, a black matrix layer BM disposed on the second base substrate BS2, and a color conversion layer CCL.

The first base substrate BS1 may include a synthetic resin substrate or a glass substrate. The circuit device layer DP-CL includes one or more insulation layers and a circuit element. The circuit element includes the signal line and the driver circuit of the pixel. The circuit device layer DP-CL may be formed through a process of forming an insulation layer, a semiconductor layer, and a conductive layer by coating or deposition, and a process of patterning the insulation layer, the semiconductor layer, and the conductive layer by a photolithography process.

In this embodiment, the circuit device layer DP-CL may include a buffer layer BFL, a first insulation layer 10, a second insulation layer 20, and a third insulation layer 30. Each of the first insulation layer 10 and the second insulation layer 20 may be an inorganic layer, and the third insulation layer 30 may be an organic layer. The third insulation layer 30 may be called (e.g., referred to as) an intermediate organic layer 30.

FIG. 3B illustrates an example of an arrangement relationship between a first semiconductor pattern OSP1, a second semiconductor pattern OSP2, a first control electrode GE1, a second control electrode GE2, a first input electrode DE1, a second output electrode SE1, a second input electrode DE2, and a second output electrode SE2, which constitute the switching transistor T1 and the driving transistor T2. First, second, third, and fourth through-holes CH1, CH2, CH3, and CH4 are illustrated exemplarily.

The display device layer DP-OLED includes a light emitting diode OLED. The display device layer DP-OLED may include an organic light emitting diode as the light emitting diode. The display device layer DP-OLED includes a pixel defining layer PDL. For example, the pixel defining layer PDL may be an organic layer.

A first electrode AE is disposed on the intermediate organic layer 30. The first electrode AE is connected to the second output electrode SE2 through the fifth through-hole CH5 passing through the intermediate organic layer 30. An opening OP is defined in the pixel defining layer PDL. The opening OP of the pixel defining layer PDL exposes at least a portion of the first electrode AE. The opening OP of the pixel defining layer PDL is called (e.g., referred to as) a light emitting opening to be distinguished from other openings.

As illustrated in FIG. 3B, the display panel DP may include an emission area PXA and a non-emission area NPXA adjacent to the emission area PXA. The non-emission area NPXA may surround the emission area PXA. In the current embodiment, the emission area PXA may be defined to correspond to a portion of the first electrode AE exposed by the light emitting opening OP.

A hole control layer HCL may be commonly disposed on the emission area PXA and the non-emission area NPXA. The hole control layer HCL may include a hole transport layer and may further include a hole injection layer. The emission layer EML is disposed on the hole control layer HCL. The emission layer EML may be commonly disposed on the emission area PXA and the non-emission area NPXA. According to an embodiment of the inventive concept, the emission layer EML may be disposed on the light emitting area PXA and may not be disposed on the non-emission area NPXA. Also, the emission EML may include an organic material and/or an inorganic material. The emission layer EML may generate a set or predetermined first color light, for example, blue light.

An electronic control layer ECL is disposed on the emission layer EML. The electron control layer ECL may include an electron transport layer and may further include an electron injection layer. The hole control layer HCL and the electron control layer ECL may be commonly formed on the plurality of pixels by utilizing an open mask. A second electrode CE is disposed on the electronic control layer ECL. The second electrode CE is commonly disposed on the plurality of pixels. A cover layer CL to protect the second electrode CE may be disposed on the second electrode CE. The cover layer CL may include an organic material and/or an inorganic material.

The second base substrate BS2 is disposed to be spaced apart from the cover layer CL. The second base substrate BS2 may include a synthetic resin substrate or a glass substrate. The color conversion layer CCL may transmit the first color light or convert the first color light into a second color light or a third color light according to the pixel PX. The color conversion layer CCL may include a quantum dot.

In an embodiment of the inventive concept, the encapsulation layer 200 may be replaced with a thin film encapsulation layer. Here, the black matrix layer BM and the color conversion layer CCL may be disposed on the thin film encapsulation layer.

Figure 4A:
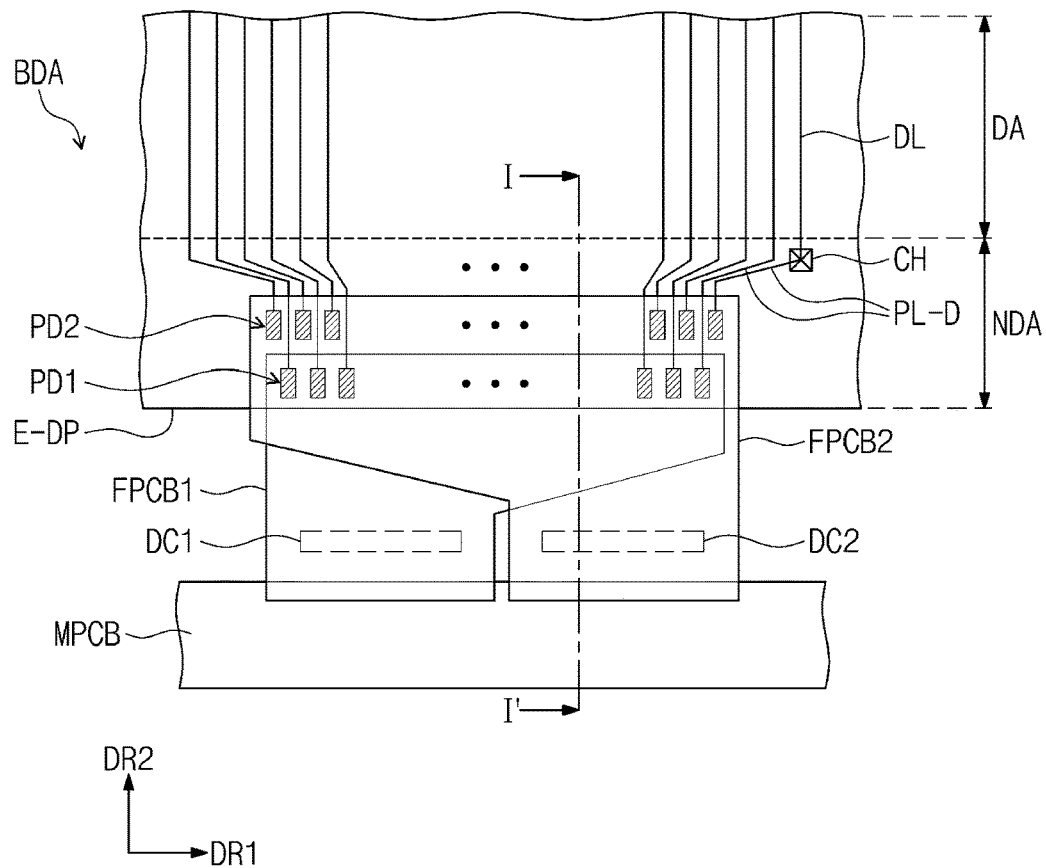
FIG. 4A is an enlarged plan view of the display device according to an embodiment of the inventive concept.
Figure 4B:
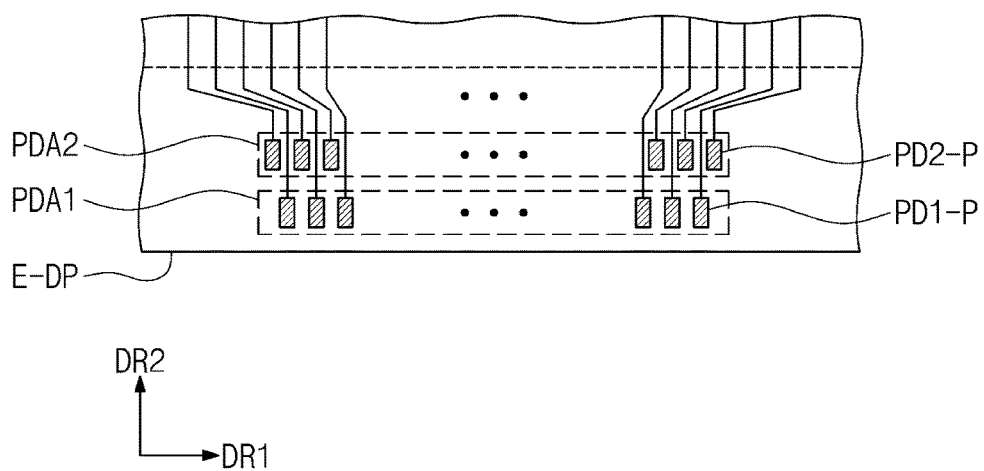
FIG. 4B is an enlarged plan view of the display panel according to an embodiment of the inventive concept.
Figure 4C:
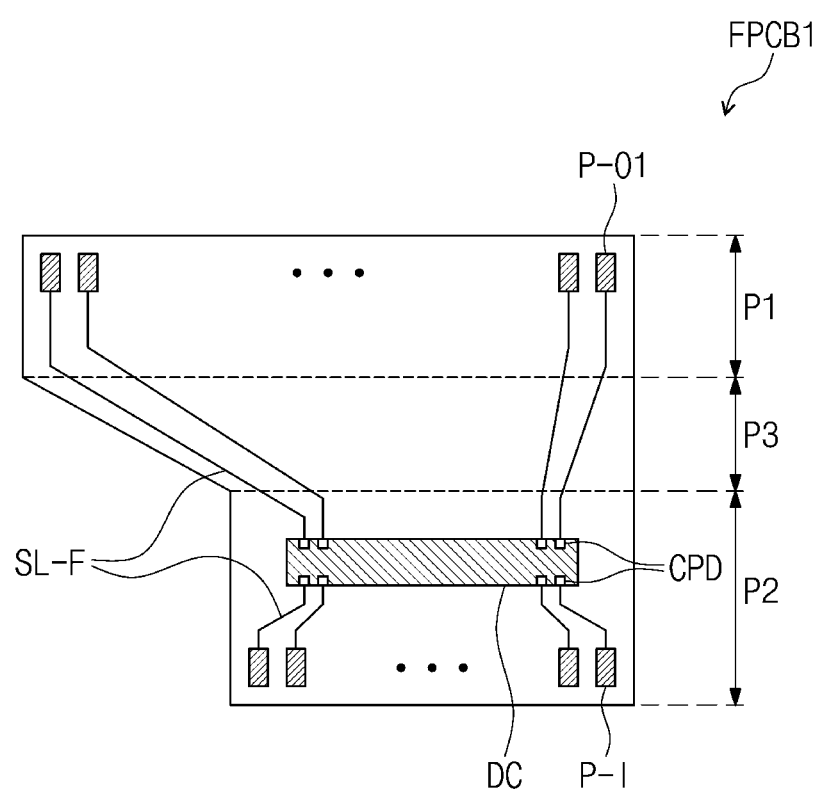
FIG. 4C is a rear view of a connection circuit board according to an embodiment of the inventive concept.

FIG. 4A is an enlarged plan view of the display device DD according to an embodiment of the inventive concept. FIG. 4B is an enlarged plan view of the display panel DD according to an embodiment of the inventive concept. FIG. 4C is a rear view of a first connection circuit board FPCB1 according to an embodiment of the inventive concept.

Hereinafter, an area on which the pad area PDA of the display panel DP and the connection circuit boards FPCB1 and FPCB2 are electrically connected to each other may be defined as a bonding area BDA of the display device DD. The output pad of each of the connection circuit boards FPCB1 and FPCB2 overlaps the pad area PDA of the display panel DP.

As illustrated in FIGS. 4A-4B, the first pad row PD1 and the second pad row PD2, which are defined as rows different from each other, are disposed on the pad area PDA. The first pad row PD1 includes a plurality of first pads PD1-P, and the second pad row PD2 includes a plurality of second pads PD2-P. The first connection circuit board FPCB1 is electrically connected to the first pad row PD1, and the second connection circuit board FPCB2 is electrically connected to the second pad row PD2.

The first connection circuit board FPCB1 and the second connection circuit board FPCB2 may have suitable sizes and shapes, which are partially different from each other, but may have structures similar to each other. FIG. 4C illustrates an example of the first connection circuit board FPCB1. The first connection circuit board FPCB1 includes an insulation layer, a plurality of pads CPD, P-01, and P-I and a plurality of signal lines SL-F. The plurality of pads CPD, P-01, and P-I and the plurality of signal lines SL-F are disposed on the insulation layer.

The plurality of pads CPD, P-01, and P-1 may include a connection pad CPD connected to connection terminals of the driving chip DC, a first pads P-01 (hereinafter, referred as first output pads) connected to the display panel DP, and second pads P-I (hereinafter, referred as input pads) connected to the main circuit board. The plurality of signal lines SL-F connect the connection pads CPD to the first output pads P-01 and connect the connection pads CPD to the input pads P-I. When the driving chip DC is omitted (e.g., not included), the signal lines SL-F may connect the first output pads P-01 to the input pads P-I.

The first output pads P-01 may be made of the same material as the signal lines SL-F. However, embodiments of the inventive concept are not limited thereto. For example, the first output pads P-01 may include copper (Cu) or gold (Au). When the first output pads P-01 are made of only copper (Cu) or gold (Au), conductivity may increase.

The first connection circuit board FPCB1 may include three portions that are divided according to a width in the first direction. That is, the first connection circuit board FPCB1 may include a first portion P1 on which the first output pads P-01 are disposed, a second portion P2 on which the input pads P-I are disposed, and a third portion P3 connecting the first portion P1 to the second portion P2. The first portion P1 may have a width greater than that of the second portion P2. The third portion P3 may have a width that gradually decreases from the first portion P1 to the second portion P2. The driving chip DC may be mounted on the second portion P2.

The second connection circuit board FPCB2 may have the same description as the first connection circuit board FPCB1 except that rather than the first output pad P-01, it includes the second output pad P-02.

As illustrated in FIG. 4A, the first portion of the first connection circuit board FPCB1 and the first portion of the second connection circuit board FPCB2 may overlap each other. The second connection circuit board FPCB2 may have an area greater than that of the first connection circuit board FPCB1. Also, the first portion of the first connection circuit board FPCB1 may be disposed inside the first portion of the second connection circuit board FPCB2 on a plane. The second portion of the first connection circuit board FPCB1 and the second portion of the second connection circuit board FPCB2 may not overlap each other. Thus, the second portion of the first connection circuit board FPCB1 connected to the main circuit board MPCB and the second portion of the second connection circuit board FPCB2 may be disposed to be spaced apart from each other on the plane.

Figure 5A:
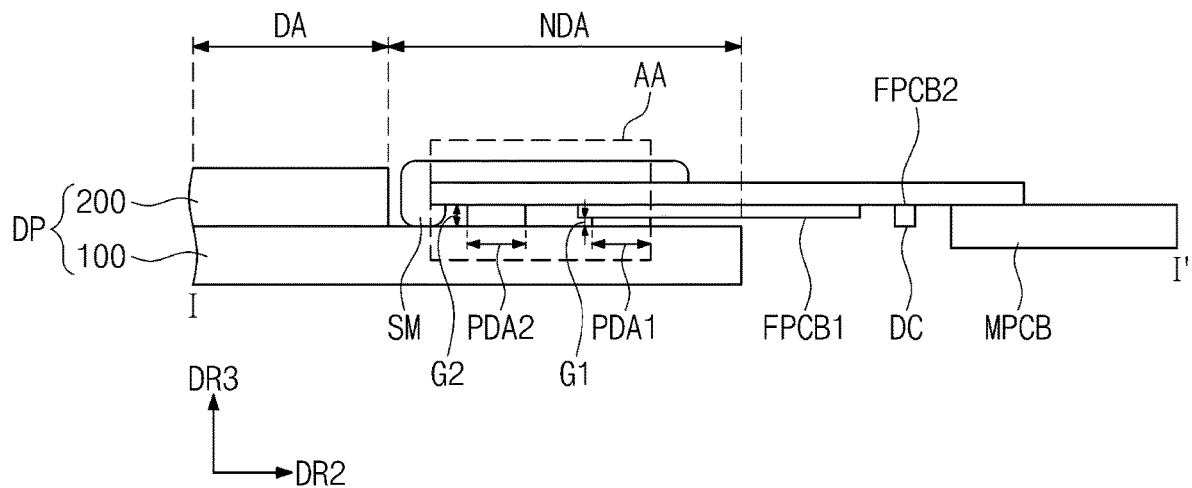
FIG. 5A is a cross-sectional view of the display device according to an embodiment of the inventive concept.
Figure 5B:
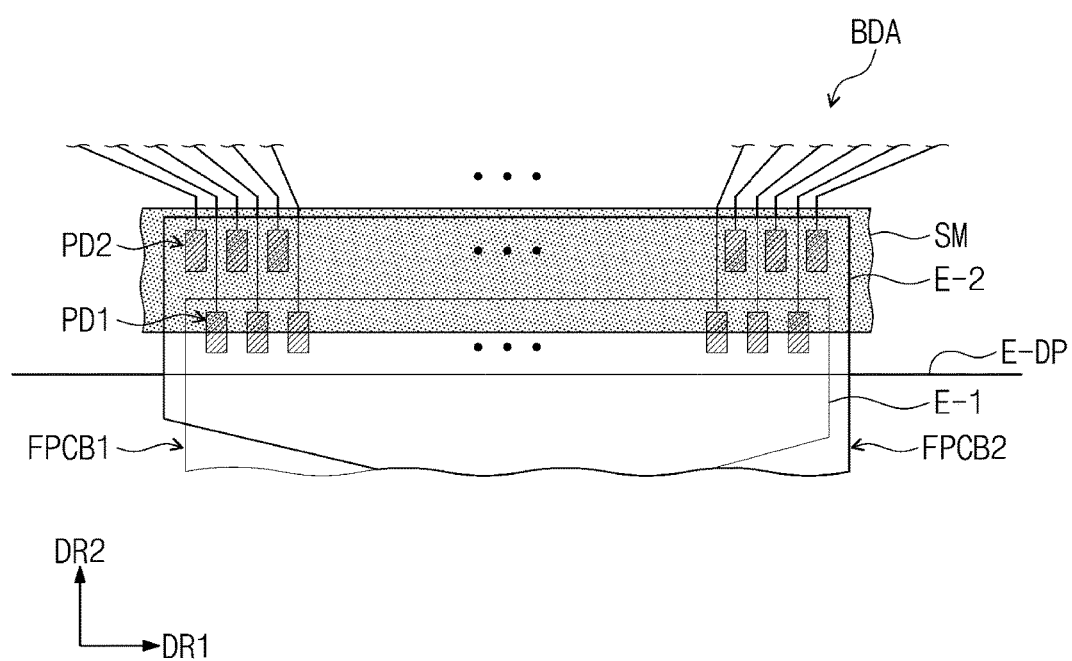
FIG. 5B is an enlarged plan view illustrating the bonding area of the display device according to an embodiment of the inventive concept.

FIG. 5A is a cross-sectional view of the display device DD according to an embodiment of the inventive concept. FIG. 5B is an enlarged plan view illustrating the bonding area of the display device DD according to an embodiment of the inventive concept. As illustrated in FIG. 5A, the second connection circuit board FPCB2 is disposed above the first connection circuit board FPCB1. Because the second connection circuit board FPCB2 is disposed above the first connection circuit board FPCB1, a second gap G2 between the display panel DP and the second connection circuit board FPCB2 is greater than a first gap G1 between the display panel DP and the first connection circuit board FPCB1. The first connection circuit board FPCB1 is connected to the first pad row PD1, and the second connection circuit board FPCB2 is connected to the second pad row PD2.

As illustrated in FIGS. 5A-5B, a sealing member SM is disposed on the first display substrate 100. The sealing member SM is disposed adjacent to the first pad row PD1 and the second pad row PD2. The sealing member SM may overlap the first pad row PD1 and the second pad row PD2 on the plane. Although the sealing member SM is shown to completely overlap the first pad area PDA1 on the plane in FIG. 5A, embodiments of the inventive concept are not limited thereto. For example, as illustrated in FIG. 5B, the sealing member SM may overlap only a portion of the first pad area PDA1 on the plane.

In this specification, "on the plane" may refer to when the display device DD is viewed in the third direction DR3 (i.e., the thickness direction).

As illustrated in FIG. 5A, the sealing member SM may cover only a portion of the non-display area NDA, but embodiments of the inventive concept are not limited thereto. For example, the sealing member SM may cover the entire non-display area NDA.

As illustrated in FIG. 5B, the sealing member SM may cover an edge E-1 of the first connection circuit board FPCB1 and an edge E-2 of the second connection circuit board FPCB2. The covered edges may be edges corresponding to the first portion P1 (see FIG. 4C). A portion of the edge E-1 of the first portion P1 in the first direction DR1 may be completely covered. That is, the edge along the first direction DR1 may be completely covered. A portion of the edge E-1 of the first portion P1 in the second direction DR2 may be partially covered. That is, the edge along the second direction DR2 may be partially covered.

The sealing member SM may seal the second gap G2 between the second connection circuit board FPCB2 and the first display substrate 100. Thus, because the second gap G2 is sealed by the sealing member SM, moisture in air may be blocked. in some embodiments, the first gap G1 between the first connection circuit board FPCB1 and the first display substrate 100 may be further sealed. For example, the sealing member SM may be disposed to be adjacent to or to overlap the edge portion E-DP of the display panel DP. Thus, because the first gap G1 is sealed by the sealing member SM, moisture in air may be blocked. The arrangement of the sealing member SM is not limited as described above. For example, the first gap G1 alone may be sealed, or both the first gap G1 and the second gap G2 may be sealed.

The sealing member SM may be made of a silicon resin having high moisture resistance. However, embodiments of the inventive concept are not limited thereto. That is, suitable materials for the sealing member SM known to those of ordinary skilled in the art may be utilized.

FIGS. 6A-6E are enlarged cross-sectional views illustrating various embodiments of the area AA of FIG. 5A.

Figure 6A:
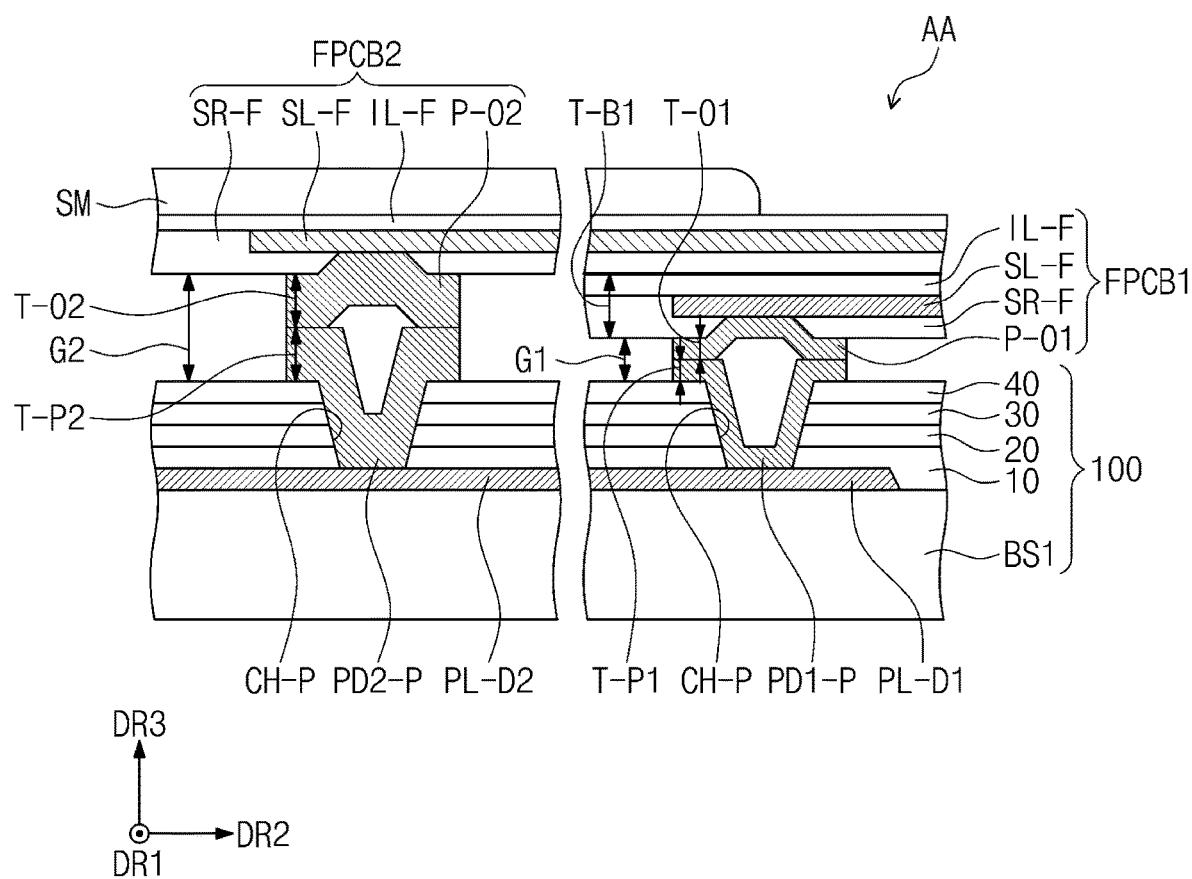
FIGS. 6A-6E are enlarged cross-sectional views illustrating various embodiments of the area AA of FIG. 5A.

In FIG. 6A, the first display substrate 100 is illustrated based on the liquid crystal display panel of FIG. 3A. The first pad PD1-P and the second pad PD2-P are connected to auxiliary signal lines PL-D1 and PL-D2 through the contact holes CH-P passing through the first to fourth insulation layers 10 to 40. The first pad PD1-P and the second PD2-P are exposed from the first to fourth insulation layers 10 to 40. When the first pad PD1-P and/or the second pad PD2-P is omitted (e.g., not included), ends of the auxiliary signal lines PL-D1 and PL-D2 may be exposed from the first to fourth insulation layers 10 to 40. In this specification, the insulation layer may refer to the first to fourth insulation layers 10 to 40.

In FIG. 6A, the first connection circuit board FPCB1 including an insulation layer IL-F, the signal line SL-F, a solder resist layer SR-F, and the first output pad P-01 and the second connection circuit board FPCB2 including an insulation layer IL-F, the signal line SL-F, a solder resist layer SR-F, and the second output pad P-02 are exemplarily illustrated.

The solder resist layer SR-F may expose each of the plurality of pads CPD, P-01, PO-2, and P-I while covering the periphery of the plurality of pads CPD, P-01, P-02, and P-I. The solder resist layers SR-F may have openings corresponding to the plurality of pads CPD, P-01, PO-2, and P-I. Although the connection circuit boards, each of which has two-layered insulation layers are exemplarily illustrated in this specification, embodiments of the inventive concept are not limited thereto. For example, each of the connection circuit boards FPCB1 and FPCB2 may have three or more insulation layers.

Because the solder resist layer SR-F is exposed to the outside, the solder resist layer SR-F may be called (e.g., referred to as) an external insulation layer. For example, a first external insulation layer may represent the solder resist layer SR-F disposed on the first connection circuit board FPCB1, and a second external insulation layer may represent the solder resist layer SR-F disposed on the second connection circuit board FPCB2.

The first output pad P-01 may directly contact the first pad PD1-P and be electrically connected to the first pad PD1-P, and the second output pad P-02 may directly contact the second pad PD2-P and be electrically connected to the second pad PD2-P. For example, the first output pad P-01 and the first pad PD1-P (and also the second output pad P-02 and the second pad PD2-P) may contact each other and be electrically connected to each other through an ultrasonic bonding method.

Because the second connection circuit board FPCB2 is disposed on the first connection circuit board FPCB1, a stepped portion may be generated by a thickness T-B1 of the first connection circuit board FPCB1. Here, the thickness T-B1 of the first connection circuit board FPCB1 refers to the distance from the top surface of the insulation layer IL-F to the bottom surface of the solder resist layer SR-F as shown in FIG. 6A. Thus, when a thickness T-P2 of the second pad PD2-P and a thickness T-02 of the second output pad P-02 are respectively the same as a thickness T-P1 of the first pad PD1-P and a thickness of T-01 of the first output pad P-01, the second connection circuit board FPCB2 may not be supported (e.g., in places where the first and second connection circuit boards do not overlap) and thus may be bent downward. For example, a portion of the second connection circuit board FPCB2 between the second pad area PDA2 (see FIG. 5A) and the first pad area PDA1 (see FIG. 5A) may be bent.

When the second connection circuit board FPCB2 is bent, because force is continuously applied to the bent portion, the force may be transmitted to the sealing member SM disposed on the second connection circuit board FPCB2. Thus, cracks may be generated in the sealing member SM, and the bonded surface of the sealing member SM may be delaminated or lifted and thus be damaged.

In this case, moisture in air may permeate into the first gap G1 and the second gap G2. The permeated moisture may contact the first pad PD1-P and/or the second pad PD2-P to corrode the first pad PD1-P and/or the second pad PD2-P.

As illustrated in FIG. 6A, according to an embodiment of the inventive concept, the thickness T-02 of the second output pad P-02 and the thickness T-P2 of the second pad PD2-P may be adjusted so that a distance from a top surface of the fourth insulation layer 40 to a bottom surface of the second connection circuit board FPCB2 is substantially the same as a distance from the top surface of the fourth insulation layer 40 to a top surface of the first connection circuit board FPCB1.

Thus, the second connection circuit board FPCB2 may be prevented or substantially prevented from being bent, and also, the sealing member SM may be prevented or substantially prevented from being damaged to reduce defects due to the corrosion of the first pad PD1-P and the second pad PD2-P. In this specification, the term "substantially the same" intends to account for the inherent deviations in measured or calculated values that would be recognized by those of ordinary skill in the art within a normal range of an error that occurs in the art.

In some embodiments, the thickness T-02 of the second output pad P-02 and the thickness T-P2 of the second pad PD2-P may be adjusted so that the distance from a top surface of the fourth insulation layer 40 to the bottom surface of the second connection circuit board FPCB2 is greater than the distance from the top surface of the fourth insulation layer 40 to the top surface of the first connection circuit board FPCB1 and less than the sum of the distance from the top surface of the fourth insulation layer 40 to the top surface of the first connection circuit board FPCB1 and the thickness of the first connection circuit board FPCB1. Here, because an absolute value of the stepped portion and the reversely stepped portion is less than a value of the thickness T-B1 of the first connection circuit board FPCB1, the bending of the second connection circuit board FPCB2 may be reduced. Thus, the defects due to the corrosion of the first pad PD1-P and the second pad PD2-P may be reduced.

Hereinafter, embodiments in which the thickness T-02 of the second output pad P-02 and the thickness of T-P2 of the second pad PD2-P are adjusted to prevent or substantially prevent the second connection circuit board FPCB2 from being bent will be described.

The sum of the thickness T-P2 of the second pad PD2-P and the thickness T-02 of the second output pad P-02 may be greater than the sum of the thickness T-P1 of the first pad PD1-P and the thickness T-01 of the first output pad P-01 and less than the sum of double of the thickness T-P1 of the first pad PD1-P, the thickness T-01 of the first output pad P-01, and the thickness T-B1 of the first connection circuit board FPCB1. For example, the thickness may satisfy the following relationship: (T-P1)+(T-01)<(T-P2)+(T-02)<2(T-P1)+(T-01)+(T-B1).

In this specification, the thickness T-P1 of the first pad PD1-P may refer to a distance between the top surface and the bottom surface of the first pad PD1-P at the portion at which the first pad PD1-P overlaps the fourth insulation layer 40 on the plane. Substantially the same contents (e.g., definitions) as the thickness T-P1 of the first pad PD1-P may be applied to the thickness T-P2 of the second pad PD2-P.

The thickness T-01 of the first output pad P-01 may refer to a distance between the top surface and the bottom surface of the first output pad P-01 at the portion at which the first output pad P-01 overlaps the solder resist layer SR-F on the plane. Substantially the same contents (e.g., definitions) as the thickness T-01 of the first output pad P-01 may be applied to the thickness T-02 of the second output pad P-02.

The sum of the thickness T-P2 of the second pad PD2-P and the thickness T-02 of the second output pad P-02 may be substantially the same as the sum of the thickness T-P1 of the first pad PD1-P, the thickness T-01 of the first output pad P-01, and the thickness T-B1 of the first connection circuit board FPCB1.

The thickness T-P2 of the second pad PD2-P may be the same as the thickness T-P1 of the first pad PD1-P, and the thickness T-02 of the second output pad P-02 may be greater than the thickness T-01 of the first output pad P-01. Here, the thickness T-02 of the second output pad P-02 may be substantially the same as the sum of the thickness T-01 of the first output pad P-02 and the thickness T-B1 of the first connection circuit board FPCB1.

The thickness T-02 of the second output pad P-02 may be the same as the thickness T-01 of the first output pad P-01, and the thickness T-P2 of the second pad PD2-P may be greater than the thickness T-P1 of the first pad PD1-P. Here, the thickness T-P2 of the second pad PD2-P may be substantially the same as the sum of the thickness T-P1 of the first pad PD1-P and the thickness T-B1 of the first connection circuit board FPCB1.

The thickness T-P2 of the second pad PD2-P may be greater than the thickness T-P1 of the first pad PD1-P, and the thickness T-02 of the second output pad P-02 may also be greater than the thickness T-01 of the first output pad P-01. Here, the sum of the thickness T-P2 of the second pad PD2-P and the thickness T-02 of the second output pad P-02 may be substantially the same as the sum of the thickness T-P1 of the first pad PD1-P, the thickness T-01 of the first output pad P-01, and the thickness T-B1 of the first connection circuit board FPCB1.

The thickness T-B1 of the first connection circuit board FPCB1 may range from about 35 micrometers to about 40 micrometers. In this case, the sum of the thickness T-P2 of the second pad PD2-P and the thickness T-02 of the second output pad P-02 may be about 0 micrometer to about 40 micrometers, for example, about 35 micrometers to about 40 micrometer, greater than the sum of the thickness T-P1 of the first pad PD1-P and the thickness T-01 of the first output pad P-01. When the thickness T-P1 of the first pad PD1-P is equal to the thickness T-P2 of the second pad PD2-P, the thickness T-02 of the second output pad P-02 may be greater than the thickness T-01 of the first output pad P-01 by the thickness T-B1 of the first connection circuit board FPCB1. For example, the thickness T-01 of the first output pad P-01 may range from about 5 micrometers to about 10 micrometers, the second output pad P-02 may have a thickness of about 40 micrometers to about 50 micrometers. However, embodiments of the inventive concept are not limited thereto. For example, the thickness T-B1 of the first connection circuit board FPCB1 may adequately vary.

As described above, because each of the second pad PD2-P and the second output pad P-02 is adjusted in thickness, the bending of the second connection circuit board FPCB2 may be reduced or prevented.

Although the thickness of each of the second pad PD2-P and the second output pad P-02 is shown as adjustable in the drawings, embodiments of the inventive concept are not limited thereto. For example, each of the other components constituting the display device DD may be adjusted in thickness. For example, the portion of each of the insulation layers SR-F, IL-F, and 10 to 40 overlapping the second pad area PDA2 (see FIG. 5A) on the plane may be adjusted in thickness.

FIGS. 6B-6E illustrate a modified example of FIG. 6A. As illustrated in FIGS. 6B-6E, the output pads P-01 and P-02 exposed from the solder resist layer SR-F may be electrically connected to the first and second pads PD1-P and PD2-P through the anisotropic conductive films ACF1 and ACF2.

In this case, to prevent or substantially prevent the second connection circuit board FPCB2 from being bent, the second anisotropic conductive film ACF2 may also be adjusted in thickness as well as the thickness of each of the second pad PD2-P and the second output pad P-02.

The sum of the thicknesses of the second pad PD2-P, the second output pad P-02, and the second anisotropic conductive film ACF2 may be greater than the sum of the thickness T-P1 of the first pad PD1-P, the thickness P-01 of the first output pad P-01, and the thickness T-A1 of the first anisotropic conductive film ACF1 and less than the sum of double of the thickness T-P1 of the first pad PD1-P, the thickness T-01 of the first output pad P-01, the thickness T-A1 of the first anisotropic conductive film ACF1, and the thickness T-B1 of the first connection circuit board FPCB1.

Figure 6B:
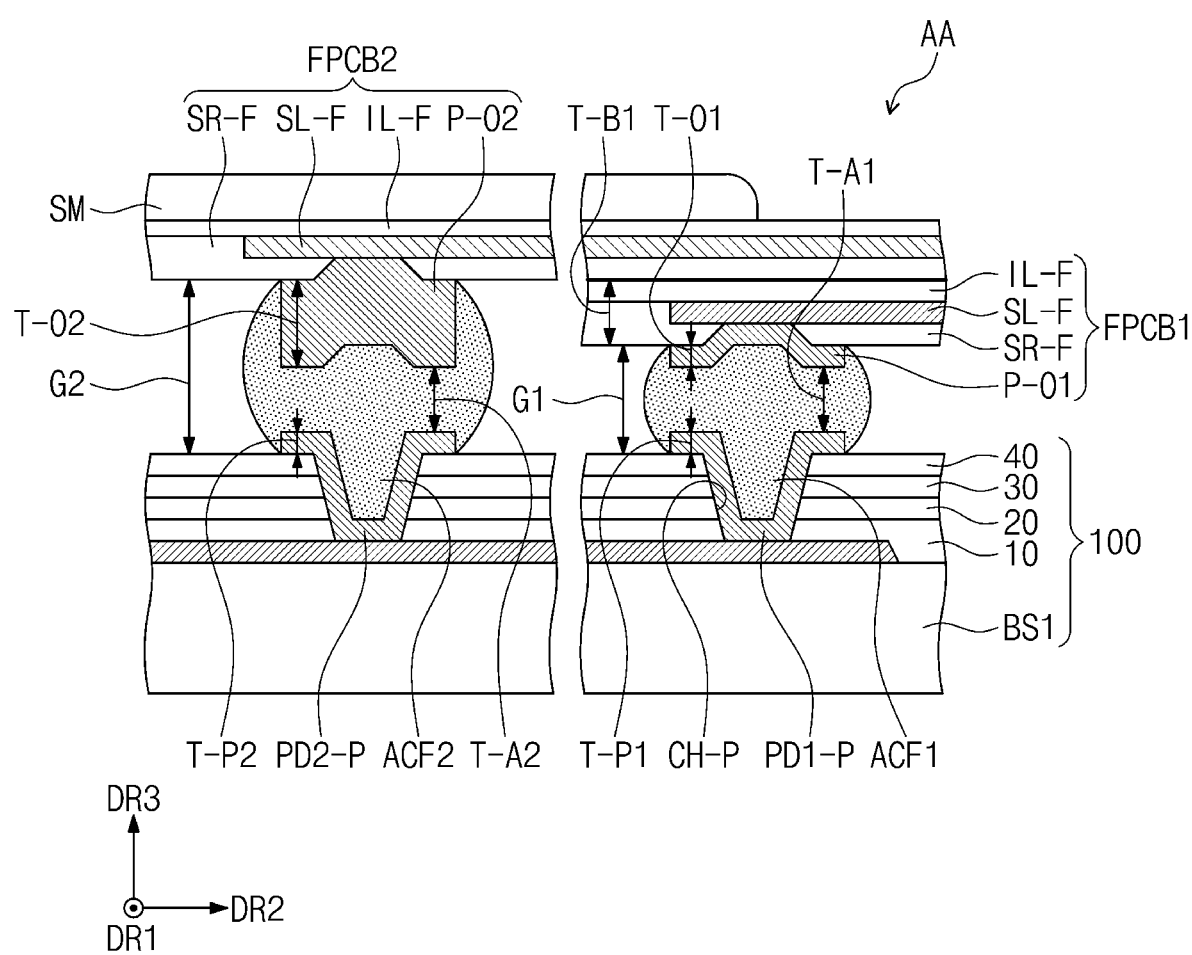
Figure 6C:
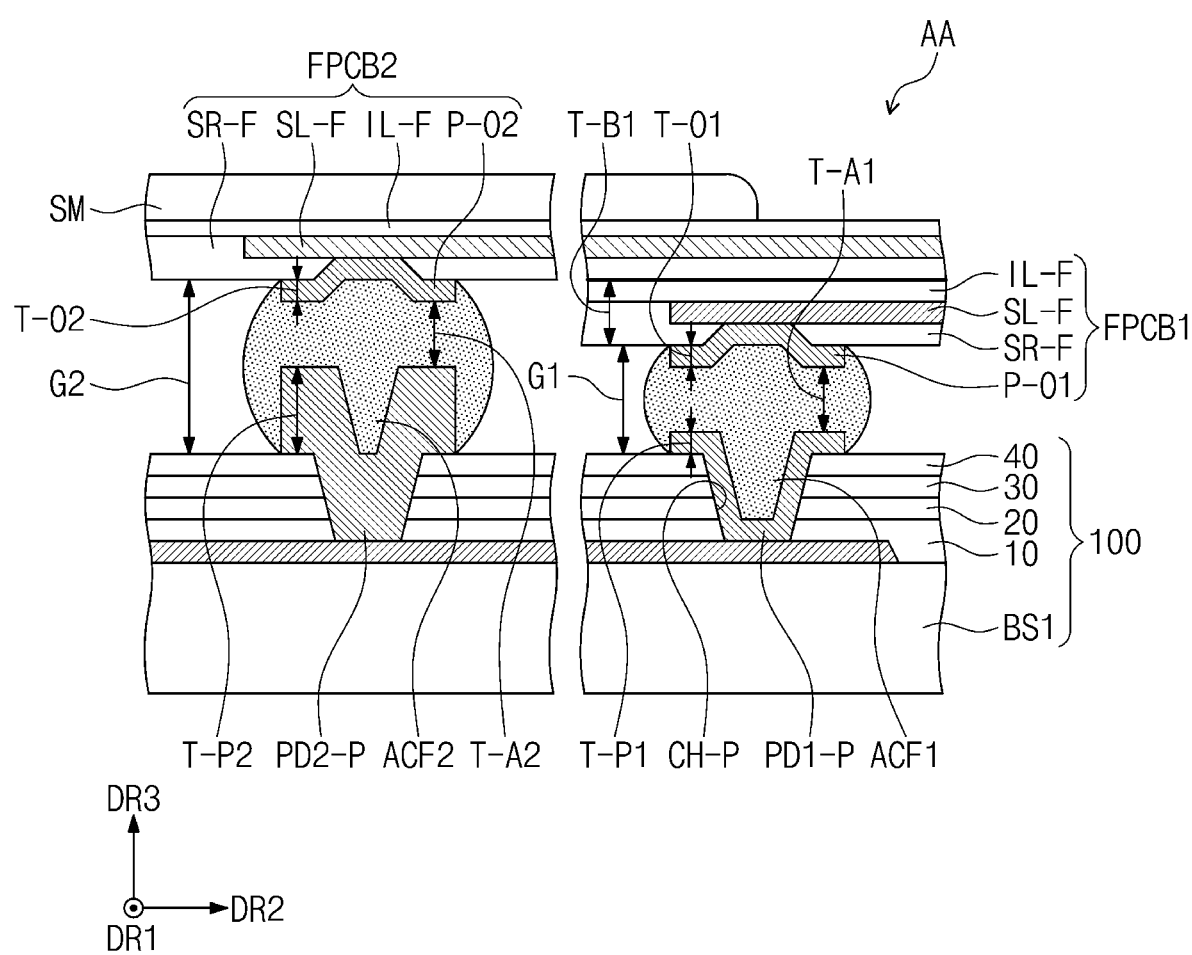

As illustrated in FIGS. 6B-6C, the thickness T-A1 of the first anisotropic conductive film ACF1 and the thickness T-A2 of the second anisotropic convictive film ACF2 may be the same. Each of the thicknesses T-A1 and T-A2 of the anisotropic conductive films ACF1 and ACF2 may be defined as a distance between the top surface of the first pad PD1-P or the second PD2-P disposed on the fourth insulation layer 40 and the bottom surface of the first output pad P-01 or the second output pad P-02 disposed on the solder resist layer SL-F.

The same content (e.g., definition) as those described with reference to FIG. 6A may be applied to FIGS. 6B-6C except that the anisotropic conductive films ACF1 and ACF2 are further disposed. That is, the thickness T-P2 of the second pad PD2-P and the thickness T-02 of the second output pad P-02 may be adjusted in the same manner as that described with reference to FIG. 6A.

Figure 6D:
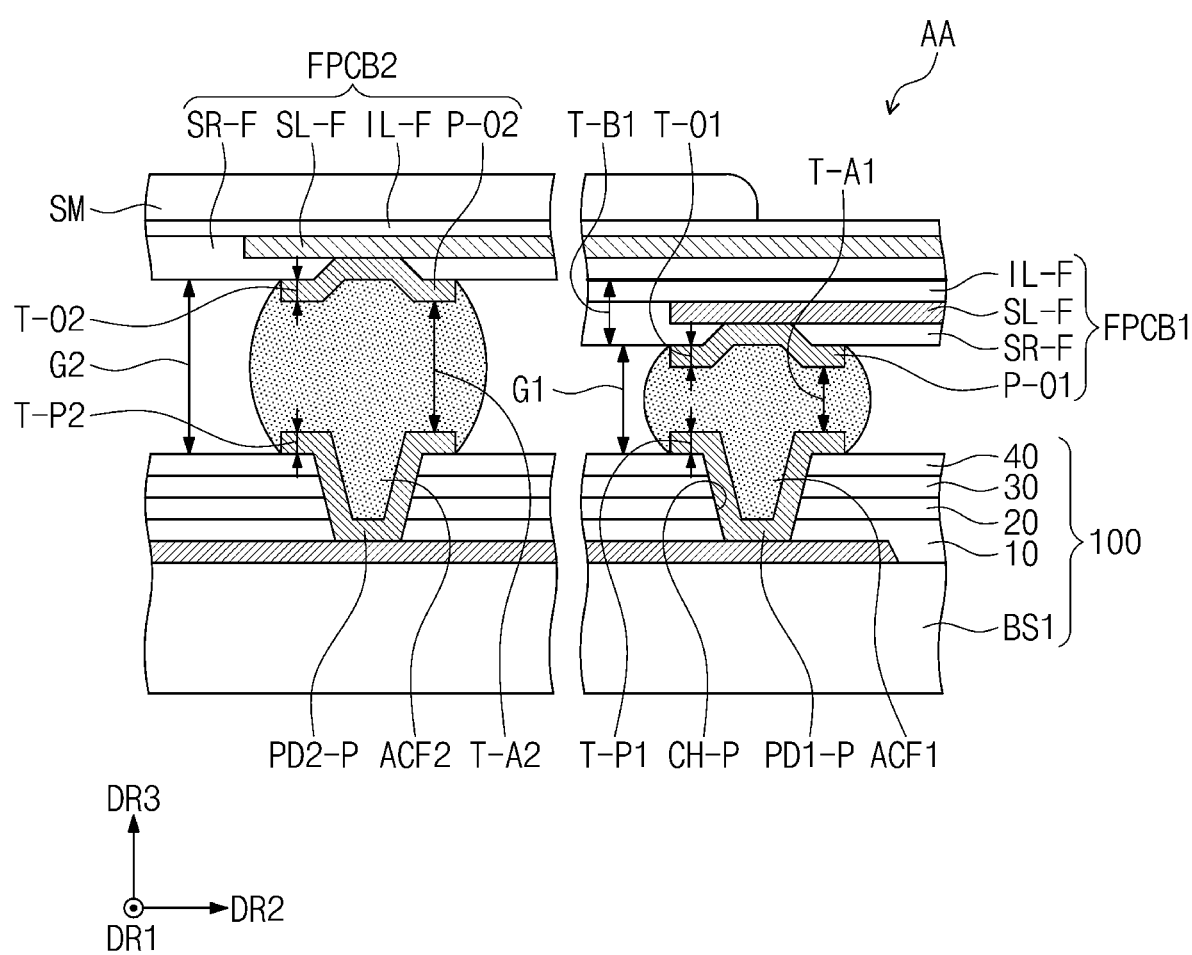

Referring to FIG. 6D, the thickness T-P1 of the first pad PD1-P and the thickness T-P2 of the second pad PD2-P may be the same, and the thickness T-01 of the first output pad P-01 and the thickness T-02 of the second output pad P-02 may be the same. The thickness T-A2 of the second anisotropic conductive film ACF2 may be greater than the thickness T-A1 of the first anisotropic conductive film ACF1. For example, the thickness T-A2 of the second anisotropic conductive film ACF2 may be greater than the thickness T-B1 of the first connection circuit board FPCB1.

Figure 6E:
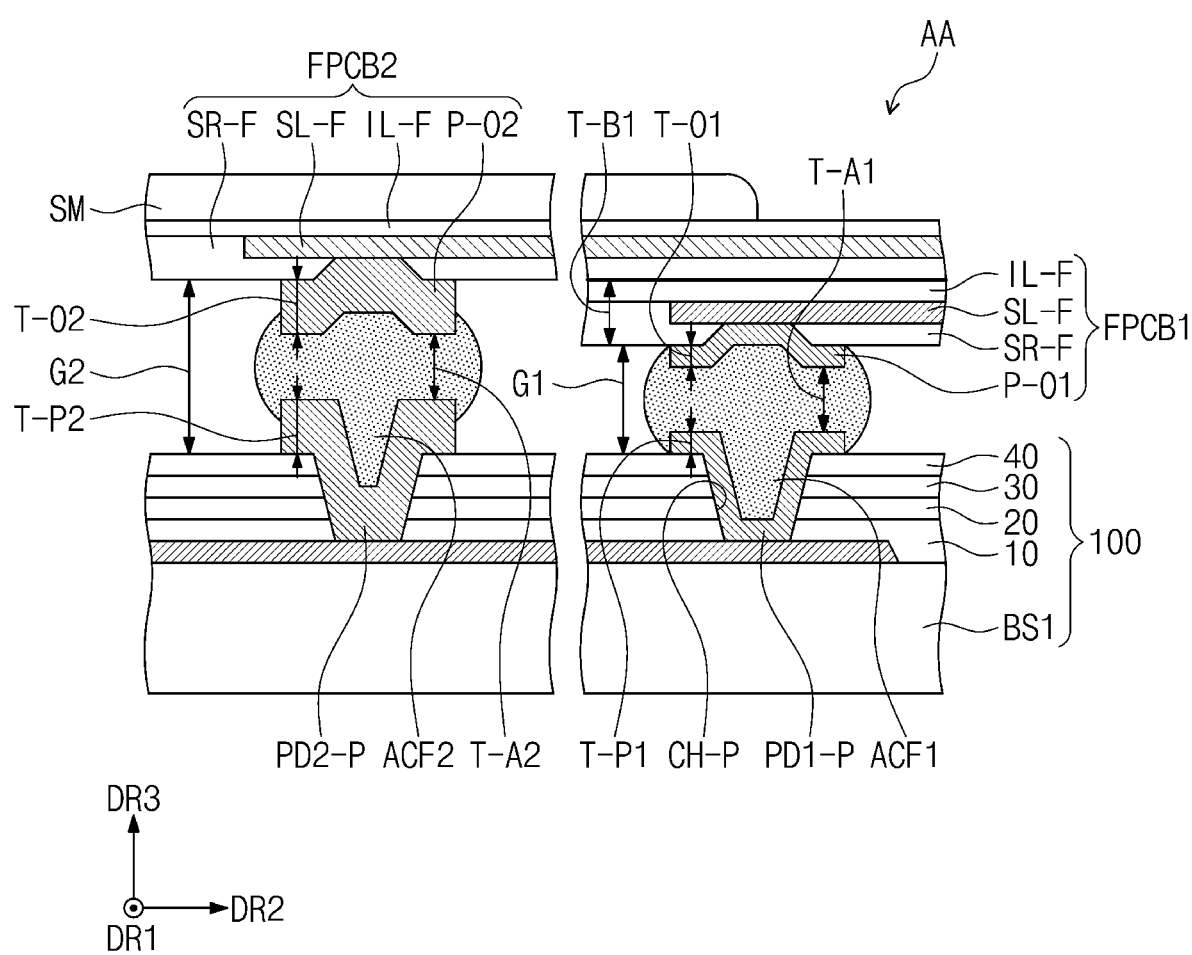

Referring to FIG. 6E, the thickness T-P2 of the second pad PD2-P may be greater than the thickness T-P1 of the first pad PD1-P, and the thickness T-02 of the second output pad P-02 may be greater than the thickness T-01 of the first output pad P-01. Also, the thickness T-A2 of the second anisotropic conductive film ACF2 may be greater than the thickness T-A1 of the first anisotropic conductive film ACF1. For example, the sum of the thickness T-P2 of the second pad PD2-P, the thickness T-02 of the second output pad P-02, and the thickness T-A2 of the second anisotropic conductive film ACF2 may be substantially the same as the sum of the thickness T-P1 of the first pad PD1-P, the thickness T-01 of the first output pad P-01, the thickness T-A1 of the first anisotropic conductive film ACF1, and the thickness T-B1 of the first connection circuit board FPCB1.

As described above, the thickness T-P2 of the second pad PD2-P, the thickness T-02 of the second output pad P-02, and the thickness T-A2 of the second anisotropic conductive film ACF2 may be adjusted so that the second connection circuit board FPCB2 is prevented or substantially prevented from being bent, or the bending of the second connection circuit board FPCB2 is reduced.

Thus, because the sealing member SM is prevented or substantially prevented from being damaged, the defects due to the corrosion of the first pad PD1-P and the second pad PD2-P may be reduced. For example, the defects due to the corrosion of the second pad PD2-P may be reduced.

According to the embodiment of the inventive concept, because the damage of the sealing member SM is prevented or reduced, the permeation of the moisture into the display panel pad unit may be effectively prevented or reduced.

According to the embodiment of the inventive concept, because the permeation of the moisture into the pad unit is prevented or reduced, the damage of the pad unit may be prevented or reduced.

According to the embodiment of the inventive concept, because the damage of the sealing member is prevented or reduced, the permeation of the moisture into the display panel pad unit may be effectively prevented or reduced.

According to the embodiment of the inventive concept, because the permeation of the moisture into the pad unit is prevented or reduced, the damage of the pad unit may be prevented or reduced.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
   a display panel comprising an insulation layer, first pads arranged with each other in a first direction and exposed from the insulation layer, and second pads arranged with each other in the first direction and exposed from the insulation layer;
   a first connection circuit board comprising a first external insulation layer and first output pads, the first output pads arranged with each other in the first direction, exposed from the first external insulation layer, and electrically connected to the first pads;
   a second connection circuit board above the first connection circuit board and comprising a second external insulation layer and second output pads, the second output pads arranged with each other in the first direction, exposed from the second external insulation layer, and electrically connected to the second pads; and
   a sealing member configured to seal a gap between the second connection circuit board and the insulation layer,
   wherein the second pads are farther from an edge of the display panel than the first pads in a second direction crossing the first direction, and
   a distance between a top surface of the insulation layer and a bottom surface of the second connection circuit board is substantially the same as that between the top surface of the insulation layer and a top surface of the first connection circuit board.

2. The display device of claim 1, wherein
   the first pad and the second pad have substantially the same thickness, and
   the second output pad has a thickness that is substantially the same as a sum of a thickness of the first output pad and a thickness of the first connection circuit board.

3. The display device of claim 2, wherein
   the first output pad has a thickness of about 5 micrometers to about 10 micrometers, and
   the second output pad has a thickness of about 40 micrometers to about 50 micrometers.

4. The display device of claim 1, wherein
the first output pad and the second output pad have substantially the same thickness, and
the second pad has a thickness greater than that of the first pad.

5. The display device of claim 1, wherein a sum of a thickness of the second output pad and a thickness of the second pad is substantially the same as a sum of a thickness of the first output pad, a thickness of the first pad, and a thickness of the first connection circuit board.

6. The display device of claim 1, further comprising:
a first conductive adhesion member between the first pad and the first output pad to electrically connect the first pad to the first output pad; and
a second conductive adhesion member between the second pad and the second output pad to electrically connect the second pad to the second output pad.

7. The display device of claim 6, wherein
the first pad and the second pad have substantially the same thickness,
the first output pad and the second output pad have substantially the same thickness, and
the second conductive adhesion member has a thickness greater than that of the first conductive adhesion member.

8. The display device of claim 6, wherein
the first pad and the second pad have substantially the same thickness, and
a sum of a thickness of the second conductive adhesion member and a thickness of the second output pad is substantially the same as a sum of a thickness of the first conductive adhesion member, a thickness of the first output pad, and a thickness of the first connection circuit board.

9. The display device of claim 6, wherein
the first output pad and the second output pad have the same thickness, and
a sum of a thickness of the second conductive adhesion member and a thickness of the second pad is substantially the same as a sum of a thickness of the first conductive adhesion member, a thickness of the first pad, and a thickness of the first connection circuit board.

10. The display device of claim 1, wherein the sealing member covers an edge area of the first connection circuit board overlapping the display panel, and an edge area of the second connection circuit board overlapping the display panel.

11. The display device of claim 1, wherein each of the first output pad and the second output pad comprises copper.

12. The display device of claim 1, wherein
the first connection circuit board further comprises a first driving chip,
the second connection circuit board further comprises a second driving chip,
a portion of the first connection circuit board overlapping the first driving chip in the first direction has a width less than a portion of the first connection circuit board overlapping the first output pads in the first direction, and
a portion of the second connection circuit board overlapping the second driving chip in the first direction has a width less than a portion of the second connection circuit board overlapping the second output pads in the first direction.

13. A display device comprising:
a display panel comprising an insulation layer, first pads arranged with each other in a first direction and exposed from the insulation layer, and second pads arranged with each other in the first direction and exposed from the insulation layer;
a first connection circuit board comprising a first external insulation layer and first output pads, the first output pads arranged with each other in the first direction, exposed from the first external insulation layer, and electrically connected to the first pads;
a second connection circuit board above the first connection circuit board and comprising a second external insulation layer and second output pads, the second output pads arranged with each other in the first direction, exposed from the second external insulation layer, and electrically connected to the second pads; and
a sealing member configured to seal a gap between the insulation layer and each of the first connection circuit board and the second connection circuit board,
wherein the second pads are farther from an edge of the display panel than the first pads in a second direction crossing the first direction, and
a sum of a thickness of the second pad and a thickness of the second output pad is greater than a sum of a thickness of the first pad and a thickness of the first output pad.

14. The display device of claim 13, wherein
the thickness of the first pad is substantially the same as that of the second pad, and
the thickness of the first output pad is greater than that of the second output pad.

15. The display device of claim 13, wherein
the thickness of the first pad is greater than that of the second pad, and
the thickness of the first output pad is substantially the same as that of the second output pad.

16. The display device of claim 13, wherein
the thickness of the first pad is greater than that of the second pad, and
the thickness of the first output pad is greater than that of the second output pad.

17. The display device of claim 13, wherein the sum of the thickness of the first pad and the thickness of the first output pad is about 40 micrometers to about 50 micrometers greater than the sum of the thickness of the second pad and the thickness of the second output pad.

18. The display device of claim 13, wherein the sealing member covers an edge area of the first connection circuit board overlapping the display panel and an edge area of the second connection circuit board overlapping the display panel.

19. The display device of claim 13, wherein each of the first output pad and the second output pad comprises copper.

20. The display device of claim 13, wherein
the first connection circuit board further comprises a first driving chip,
the second connection circuit board further comprises a second driving chip,
a portion of the first connection circuit board overlapping the first driving chip in the first direction has a width less than a portion of the first connection circuit board overlapping the first output pads in the first direction, and
a portion of the second connection circuit board overlapping the second driving chip in the first direction has a width less than a portion of the second connection circuit board overlapping the second output pads in the first direction.

\* \* \* \* \*